United States Patent [19]

Mooradian et al.

[11] Patent Number: 5,627,853

[45] Date of Patent: May 6, 1997

[54] OPTIMIZED LASER ENERGY CONVERSION THROUGH AUTOMATIC MODE MATCHED PUMPING

[75] Inventors: Aram Mooradian, Winchester; Mark E. Kuznetsov, Lexington, both of Mass.

[73] Assignee: Coherent, Inc., Santa Clara, Calif.

[21] Appl. No.: 448,419

[22] PCT Filed: Mar. 16, 1995

[86] PCT No.: PCT/US95/03375

§ 371 Date: Jun. 1, 1995

§ 102(e) Date: Jun. 1, 1995

[87] PCT Pub. No.: WO95/25366

PCT Pub. Date: Sep. 12, 1995

Related U.S. Application Data

[63] Continuation-in-part of Ser. No. 214,878, Mar. 16, 1994.

[51] Int. Cl.[6] .................. H01S 3/05; H01S 3/18
[52] U.S. Cl. .................. 372/92; 372/96; 372/50; 372/18; 372/33
[58] Field of Search .................. 372/96, 50, 72, 372/18, 43, 33

[56] References Cited

U.S. PATENT DOCUMENTS

| | | | |
|---|---|---|---|
| 3,688,388 | 9/1972 | Dyment et al. | 569/29 |
| 4,378,599 | 3/1983 | Damen et al. | 372/43 |
| 4,539,687 | 9/1985 | Gordon et al. | 372/43 |
| 4,710,940 | 12/1987 | Sipes, Jr. | 372/75 |
| 4,745,618 | 5/1988 | Burger | 372/101 |
| 4,787,086 | 11/1988 | Dentai et al. | 372/19 |
| 4,847,851 | 7/1989 | Dixon | 372/75 |
| 4,872,175 | 10/1989 | Nakatsuka et al. | 372/46 |
| 4,872,177 | 10/1989 | Baer et al. | 372/75 |
| 4,890,289 | 12/1989 | Basu et al. | 372/33 |
| 4,935,939 | 6/1990 | Liau et al. | 372/98 |
| 4,947,402 | 8/1990 | Kane | 372/70 |
| 4,949,350 | 8/1990 | Jewell et al. | 372/45 |
| 5,001,718 | 3/1991 | Burrows et al. | 372/33 |
| 5,033,052 | 7/1991 | Masuko et al. | 372/36 |
| 5,046,070 | 9/1991 | Negus | 372/33 |
| 5,048,051 | 9/1991 | Zayhowski | 372/101 |
| 5,052,016 | 9/1991 | Mahbobzadeh et al. | 372/96 |
| 5,073,041 | 12/1991 | Rastani | 385/33 |
| 5,073,892 | 12/1991 | Uomi et al. | 372/45 |
| 5,081,639 | 1/1992 | Snyder et al. | 372/101 |
| 5,093,838 | 3/1992 | Kubota | 372/107 |
| 5,123,025 | 6/1992 | Papuchon et al. | 372/72 |
| 5,123,026 | 6/1992 | Fan et al. | 372/75 |
| 5,130,997 | 7/1992 | Ortiz et al. | 372/21 |
| 5,131,002 | 7/1992 | Mooradian | 372/50 |
| 5,132,980 | 7/1992 | Connors et al. | 372/33 |
| 5,148,322 | 9/1992 | Aoyama et al. | 359/708 |
| 5,161,164 | 11/1992 | Shigihara et al. | 372/20 |
| 5,177,752 | 1/1993 | Ohya et al. | 372/22 |
| 5,228,049 | 7/1993 | Paoli | 372/50 |
| 5,237,584 | 8/1993 | Shannon et al. | 372/93 |
| 5,245,618 | 9/1993 | Masuda et al. | 372/22 |
| 5,253,262 | 10/1993 | Kurobe et al. | 372/45 |
| 5,257,277 | 10/1993 | Yagi et al. | 372/75 |
| 5,265,116 | 11/1993 | Mooradian | 372/75 |
| 5,287,377 | 2/1994 | Fukuzawa et al. | 372/45 |
| 5,289,485 | 2/1994 | Mooradian | 372/45 |

FOREIGN PATENT DOCUMENTS

| | | | |
|---|---|---|---|
| 0508406A3 | 10/1992 | European Pat. Off. | H01S 3/109 |
| 0519078A1 | 12/1992 | European Pat. Off. | H01S 3/094 |
| 0549853A1 | 7/1993 | European Pat. Off. | H01S 3/103 |
| 63-280484 | 11/1988 | Japan | H01S 3/18 |
| 4247676 | 9/1992 | Japan | H01S 3/18 |

OTHER PUBLICATIONS

DeSilvestri et al., "Pump–Power Stability Range of Single–Mode . . ." IEEE Journal of Quant. Elec. vol. 23, No. 11 Nov. 1987 pp. 1999–2003.

P.F. Moulton, et al., "Recent Advances in Transition–Metal–Doped Tunable Lasers," *Proceedings of an International Conference of Lasers*, pp. 437–446 (May 1980).

Moulton, P.F., "An Investigation of the $Co:MgF_2$ Laser System," *IEEE Journal of Quantum Electronics*, vol. QE–21, No. 10, pp. 1582–1595 (Oct. 1985).

Harkness, G.K., et al., "Transverse Modes of Microchip Solid State Lasers," *Journal of Modern Optics*, vol. 39, No. 10, pp. 2023–2037 (1992). (No Month Available).

Valk, B., et al. "Optically Pumped Mode–Locked Multiple Quantum Well Laser," *Appl. Phys. Lett.* 49(10): 549–551 (Sep. 1986).

Karin, J.R., et al. "Generation of Picosecond Pulses With a Gain-Switched GaAs Surface-Emitting Laser," *Appl. Phys. Lett.* 57(10): 963–965 (Sep. 1990).

Raja, M.Y.A., et al., "Surface-Emitting, Multiple quantum Well GaAs/AlGaAs Laser with Wavelength-resonant Periodic Gain Medium," *App. Phys. Lett.* 53(18): 1678–1680.

Nakwaski, W., et al., "Thermal Waveguiding in Etched Well Surface Emitting Diode Lasers," *Proceedings of the Conference on Lasers and Electrooptics (Cleo) 1991 Technical Digest Series*, vol. 10:262 (May 1991).

Mead, P.F., et al., "Single–Mode Operation of Diode–Pumped Nd:YAG Lasers by Pump–Beam Focusing," *IEEE Journal of Quantum Electronics*, vol. 30, No. 12, (Dec. 1994).

*Primary Examiner*—Rodney B. Bovernick
*Assistant Examiner*—Yisun Song
*Attorney, Agent, or Firm*—Hamilton, Brook, Smith & Reynolds, P.C.

[57] ABSTRACT

An apparatus and method for stabilizing the transverse mode of laser oscillation in a vertical cavity semiconductor laser and a microchip laser are disclosed. A preferred embodiment includes a quantum-well region formed over a semiconductor substrate. A first reflective surface is formed over the quantum-well region, and a second reflective surface is formed over the substrate, opposite the first reflective surface, forming a laser cavity. The quantum-well region is optically pumped, producing laser oscillation. The absorbed pump power causes a thermal lensing effect within the semiconductor material, stabilizing the transverse spatial mode of the laser cavity. The radius of curvature of the thermal lens is a function of absorbed pump power. Maximum power conversion efficiency is achieved if the pump power is controlled such that the diameter of the oscillating mode matches the diameter of the pump beam. The invention has applications in optical communication and laser printing.

35 Claims, 10 Drawing Sheets

OPTIMIZED LASER ENERGY CONVERSION THROUGH AUTOMATIC MODE MATCHED PUMPING

This is the U.S. National Phase Application of Patent Cooperation Treaty International Application No. PCT/US95/03375, filed Mar. 16, 1995, which is a continuation-in-part of copending application U.S. Ser. No. 08/214,878, filed Mar. 16, 1994.

BACKGROUND OF THE INVENTION

Optically-pumped solid-state lasers have been useful sources of coherent radiation for more than 20 years. In recent years, improvements in laser performance have resulted from the fabrication of semiconductor quantum-well structures. In a quantum-well structure, thin atomic layers of smaller energy bandgap semiconductor material, for example GaAs, are sandwiched between thin layers of wider bandgap material, for example $Al_xGa_{(1-x)}As$, to form potential wells in the conduction and valence bands. Such wells restrict or limit carrier/electron movement to two dimensions. Quantum-well heterostructures generally exhibit more efficient luminescence intensities than bulk crystal heterostructures and therefore, have been incorporated into the active region of semiconductor laser devices.

In current solid-state microchip lasers, the laser cavity geometry determines the volume of a laser mode propagating therein. A typical microchip laser cavity comprises a gain medium disposed between a pair of curved mirrors. Incoherent pump energy, for example laser diode output, is directed into the cavity using various techniques. Certain pumping techniques are more efficient than others.

Laser efficiency is the proportion of pump energy which is converted to coherent output energy. Pump energy directed into the cavity that is not converted to output energy is emitted as wasted incoherent energy or converted into heat. The more pump energy that is wasted, the lower the efficiency of the laser.

In the past, solid-state lasers were side-pumped in a transverse direction with incoherent diodes along the length of the gain medium. Side-pumped lasers are relatively inefficient, because the entire gain medium volume is pumped, with laser gain occurring only in a small central volume of the gain medium. The pump energy is dispersed throughout the gain medium, rather than being concentrated within the volume of the resonant laser mode. This results in inefficient energy conversion.

Recently, end-pumped solid-state lasers have improved conversion efficiency. In end-pumped lasers such as those described in U.S. Pat. No. 4,710,940, incoherent pump energy is longitudinally focused with optics through the entrance and/or exit mirrors into the central portion of the gain medium within the diameter of the resonating laser mode. This technique is thus limited in that the laser mode volume is predetermined by the geometry of the laser cavity, and therefore, the diameter of the pump beam must be matched to the predicted laser mode diameter for efficient operation.

SUMMARY OF THE INVENTION

The present invention is directed to an apparatus and method for stabilizing the transverse mode of laser oscillation in quantum-well semiconductor lasers and solid-state microchip lasers. The apparatus of the invention comprises a substrate preferably of semiconductor material, having first and second opposed faces. A mirror having a predetermined radius of curvature is formed over the first face of the substrate. A quantum-well structure is formed on the second face of the substrate. A second mirror is formed on the quantum-well structure, the first and second mirrors defining a resonant cavity therebetween. A source is provided for electrically or optically pumping the quantum-well layer to produce laser gain. The laser gain causes a laser mode having a particular wavelength and a particular transverse diameter to oscillate. The diameter of oscillating mode is a function of the radius of curvature of the first mirror, the optical length of the resonant cavity, and the wavelength of the oscillating mode.

In another embodiment, the second mirror has a predetermined radius of curvature in addition to the first curved mirror.

In another embodiment, the substrate is formed of semiconductor or other light-transparent material having a positive temperature variant refractive index and the first and second mirror on the substrate are fabricated substantially flat. As the laser is pumped, the absorbed pump light causes heating of the semiconductor material and therefore a thermal lensing effect within the laser cavity. The thermal lens is caused by the thermally induced increase in refractive index or an actual physical bulging of the material surface due to thermal expansion. The thermal lens causes an effective mirror radius of curvature which is a function of absorbed pump power, size of the pumped spot, thermal conductivity of the material, heat sinking conditions, refractive index variation with temperature, and thermal expansion coefficient.

The output radiation of the laser may be converted to a second harmonic using well known non-linear frequency conversion materials.

The laser may be used to generate trains of short optical pulses by operating in the gain-switched, Q-switched or modelocked regime.

The laser output can be coupled to an external cavity to extend functionality of the device. For example, the laser with an external cavity may be tuned by a grating reflector, may be modelocked or may have narrow linewidth operation. The external cavity may also be used for controlling the transverse spatial mode of the laser.

For those applications which require several longitudinal modes, spatial hole burning may be induced in the laser by spacing the quantum-well regions so that they are near optical field antinodes corresponding to the different axial mode numbers.

In another embodiment, an electric field is applied in a direction transverse to that of the laser beam, sweeping optically excited carriers out of the gain region. This provides a means for modulating the amplitude of the laser output.

The laser frequency may be shifted by applying a longitudinal electric field to the quantum-well structure to provide a quantum-confined Stark shift to the gain peak.

The present invention is further directed to an apparatus and method for automatic mode-matched pumping of semiconductor and microchip lasers. The method of the invention comprises the steps of disposing an active laser medium between two opposed substantially parallel reflective surfaces. The reflective surfaces define a resonant cavity therebetween which includes the active medium. The cavity is pumped in a longitudinal direction with pump energy of a first diameter and of a certain power. The absorbed pump energy produces gain in the active laser medium between the two reflective surfaces and causes a laser beam to oscillate in the laser cavity. Absorbed pump energy also heats a longitudinal volume of the cavity, forming a thermal lens which concentrates the resonating laser beam within a second diameter. The effective radius of curvature of the thermal lens is a function of the pump power. Maximum pump energy to output energy conversion efficiency is achieved by controlling the pump power such that the second diameter and first diameter are substantially equivalent. The invention is operable for both solid-state and semiconductor gain media.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
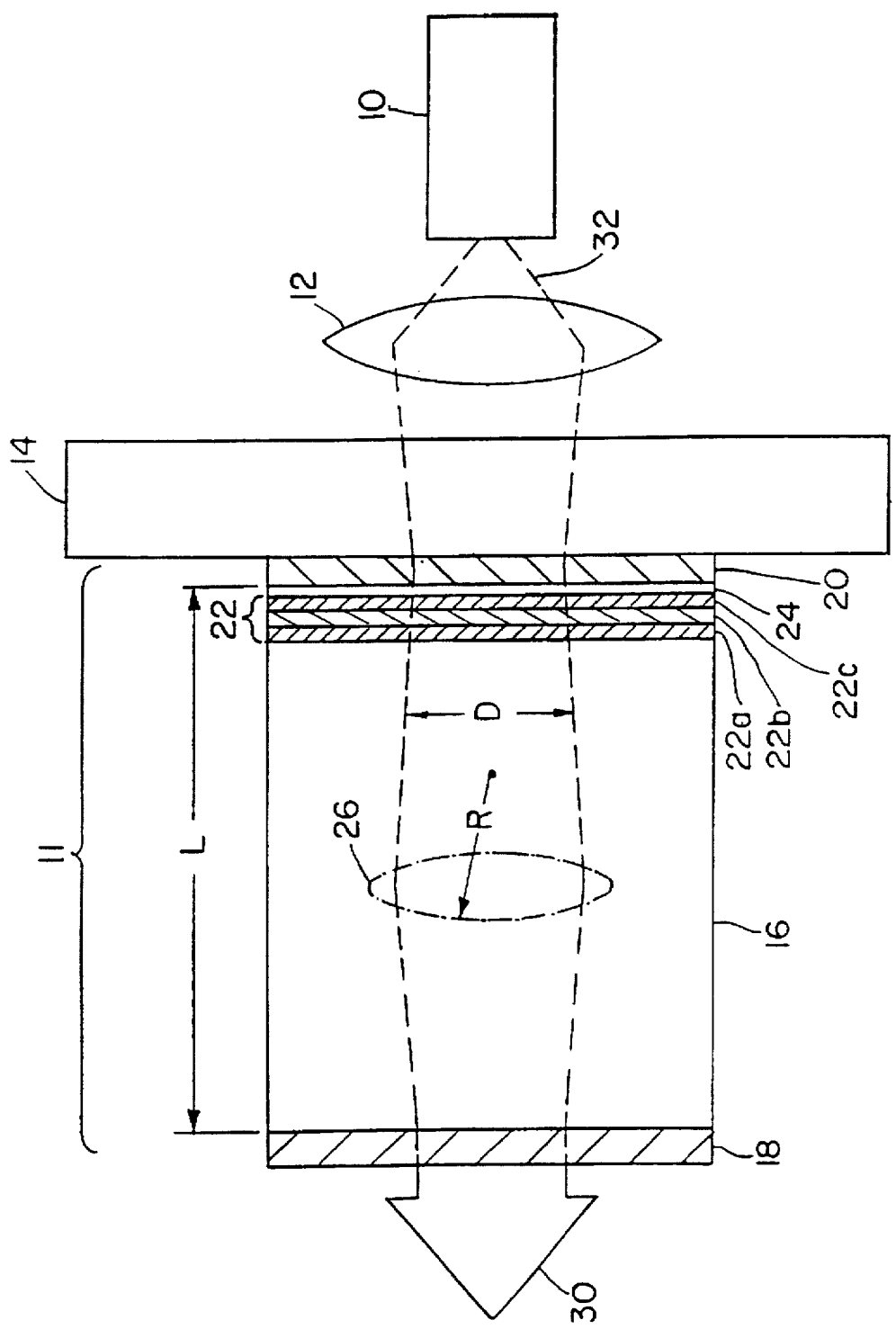
FIG. 1 is a cross-sectional view of a semiconductor laser in accordance with the present invention.

FIG. 1 is a cross-sectional view of a semiconductor laser in accordance with the present invention. A preferred embodiment includes an optical pump source 10, optional pump light focusing optics 12, a pump-light- transparent heat sink 14, and a semiconductor laser 11.

The laser 11 comprises a substrate 16, for example a semiconductor substrate, upon which alternate layers of semiconductor material 22a, 22b, 22c are formed. The layers 22a, 22b, 22c of semiconductor material form a single or multiple quantum-well structure. Note that for purposes of the invention, quantum-wells are not limited to thin layers but may be used in varying degrees of thickness. An optional buffer layer 24 is formed on the quantum-well structure. The opposing end surfaces are fabricated to form a flat-flat surface and are coated with a suitable material to form an entrance mirror 20 and an exit mirror 18 which define a resonant cavity of length L therebetween.

The resonant cavity is pumped by pump light 32 emitted from the pump source 10 and optionally focused by optics 12. At a threshold level, a mode of laser light begins to resonate. Pump light absorbed in the semiconductor material generates heat. The heat induces a change in the refractive index of the semiconductor material, causing a thermally-induced lensing effect in the laser cavity illustrated by the dot-dash lines 26. The lensing effect 26 automatically stabilizes the transverse spatial mode resonating within the laser cavity. The dn/dT, or change in refractive index n, with temperature T, for typical semiconductor materials ranges from $2 \times 10^{-4}$ to $4 \times 10^{-4}$ per degree celsius, which is at least 10 times greater than the dn/dT for solid-state materials such as Nd:YAG. The heat sink 14 comprises pump-light-transparent material such as sapphire, and is used to draw excess heat away from the laser.

For a laser with a near flat-flat cavity and two curved mirrors, the cavity mirror effective radius of curvature R, is related to the optical length of the cavity L, the wavelength of the mode $\lambda$ and the mode diameter D, according to the following formula:

$$R = \left( \frac{D^2}{\lambda L} \right)^2 \frac{\pi^2 L}{8} . \tag{1}$$

In solid-state microchip lasers such as those of FIGS. 7–10, pump light is absorbed along the whole length of the laser cavity and thermally induces an optical waveguide. In contrast, the semiconductor laser of FIG. 1 has light absorbed in a few-micrometer-thick absorbing region. The effective radius of curvature R induced by this thin thermal lens can be estimated from the following formula:

$$R = \frac{n_0 D_{th}^2}{8 h_{th} \Delta T \frac{dn}{dT}} \tag{2}$$

assuming quadratic transverse temperature distribution. Here, $n_0$ is the material refractive index, $D_{th}$ and $h_{th}$ are the diameter and thickness of the heated region, and $\Delta T$ is the temperature rise at the center of the heated region.

The effective mirror radius is a function of the absorbed laser pump power, size of the pumped spot, heat sinking conditions, thermal conductivity of the material and the dn/dT for the material. A device of this sort with mirrors deposited on the opposing flat faces of the wafer may operate with power levels exceeding 1 watt continuous wave, with appropriate heat sinking.

With a cavity length of a few hundred micrometers to a few millimeters, a stable $TEM_{00}$ mode is produced with a laser system made in accordance with the above formula. In contrast to the solid-state microchip lasers of the prior art, the quantum-well gain regions of the present invention must be positioned near the anti-nodes of the laser optical standing wave. See U.S. Pat. No. 5,131,002, incorporated herein by reference. This spatial positioning ensures efficient power extraction from the laser gain medium and also ensures that a single longitudinal mode is produced. Also, by way of contrast with solid-state laser gain material, there is a near absence of spectral and spatial hole burning in semiconductor lasers. This phenomenon is described in Mark W. Fleming and Aram Mooradian, "Spectral Characteristics of External-Cavity Controlled Semiconductor Lasers," IEEE Journal of Quantum Electronics, Vol. QE-17, No. 1, 44–59, Jan. 1981. This enables semiconductor quantum-well lasers to operate in a single longitudinal mode.

The pump light may be coupled into the semiconductor absorption region using any of several well known methods such as focusing with a lens, butt coupling, and fiber coupling. Because the absorption length is very short, typically about a few micrometers, one need only provide for mode-matched pumping in the transverse directions. In fact, concentration of the pump light can be accomplished with non-imaging optics.

Figure 2:
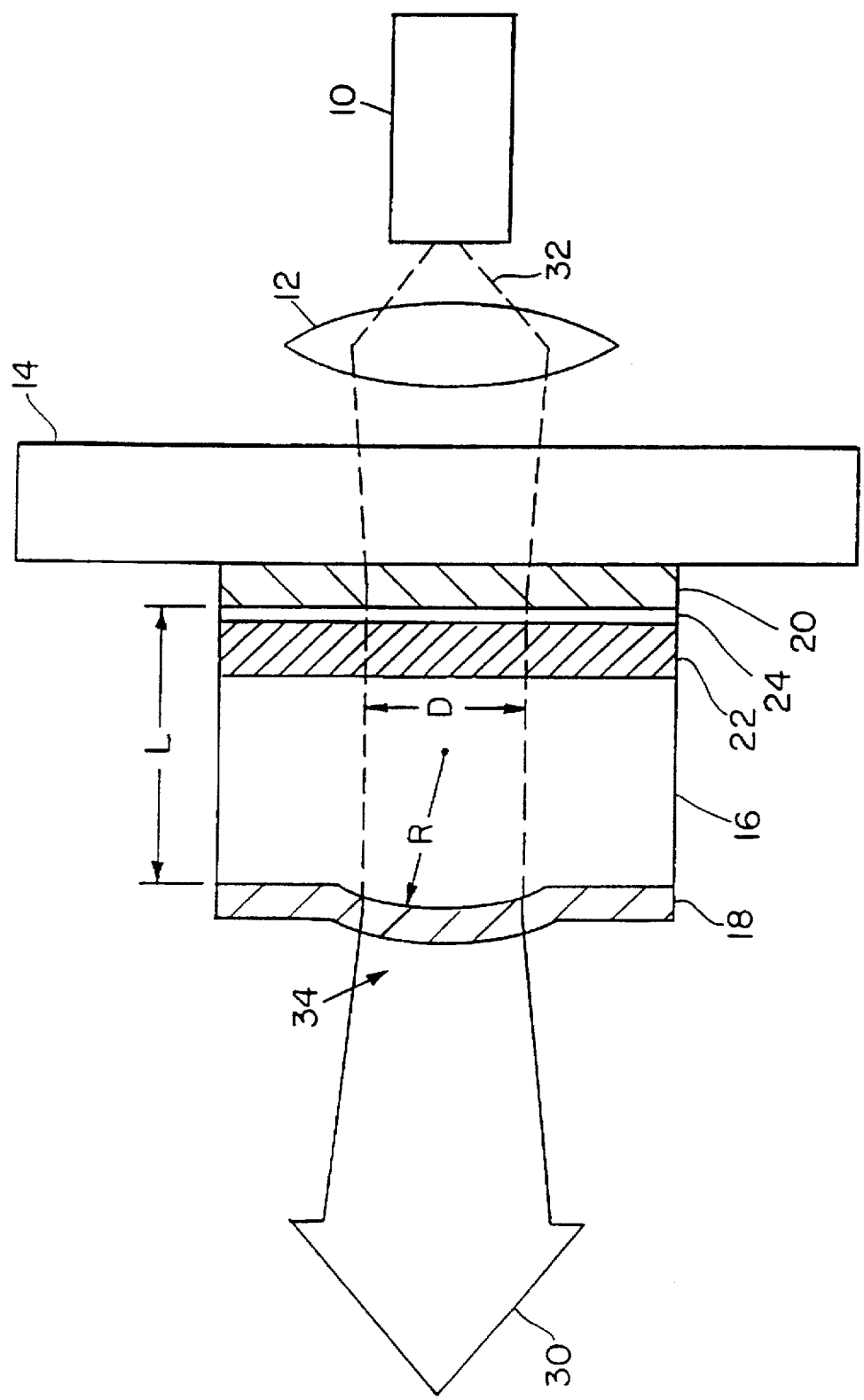
FIG. 2 is a cross-sectional view of a semiconductor laser wherein a microlens is formed on the substrate in accordance with the present invention.

FIG. 2 is a cross-sectional diagram of a semiconductor laser having a curved exit mirror 18 and a flat entrance mirror 20. In this case, the cavity mirror effective radius of curvature R, is related to the optical length of the cavity L and the mode diameter D as in the following formula:

$$R = \left(\frac{D^2}{\lambda L}\right)^2 \frac{\pi^2 L}{16} . \quad (3)$$

where λ is the wavelength of the mode oscillating within the laser cavity. Alternatively, microlenses may be bonded directly onto the wafer or binary optical lenses may be used with a dielectric reflective overcoat. Stable curved mirror resonators may also be fabricated directly onto the semiconductor laser wafer by well known techniques such as selective etching as described in U.S. Pat. No. 4,894,840, incorporated herein by reference.

The laser mirrors may be dielectric multi-layers directly deposited onto the substrate or may be grown by Molecular Beam Epitaxy (MBE) or Metal-Organic Vapor Phase Epitaxy (MOVPE) processes to deposit semiconductor multi-layers as is well known in the art. The entrance mirror 20 must be transmissive to light at the pump wavelength 32 while being highly reflective to the light at the lasing wavelength 30. The exit mirror 18 must be partially transmissive to light at the lasing wavelength, permitting a laser beam 30 to exit the laser.

Figure 3:
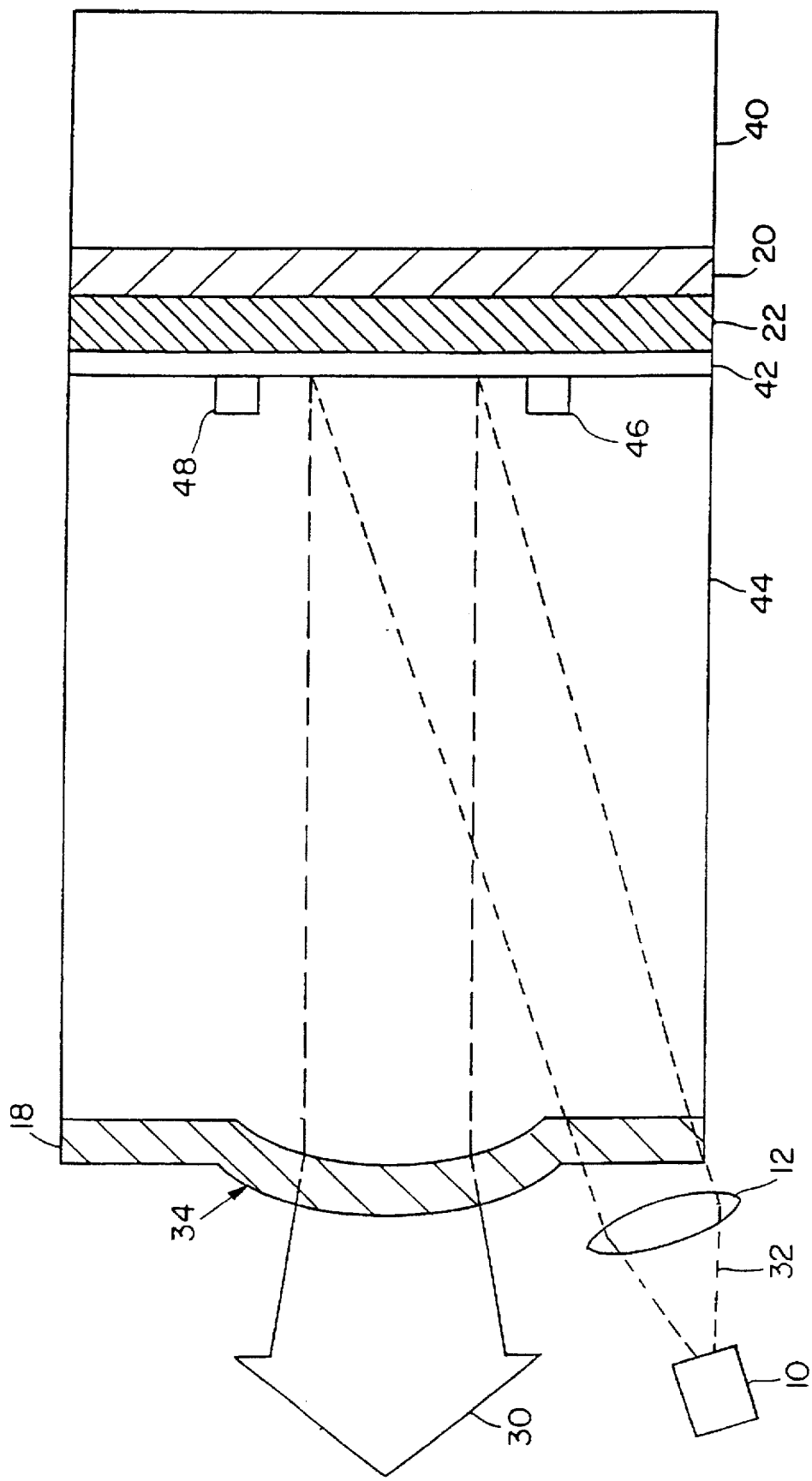
FIG. 3 is a cross-sectional view of a semiconductor laser wherein the laser cavity is pumped at the exit mirror and wherein the cavity is substantially comprised of a transparent material in accordance with the present invention.

The present invention may be configured in transmitting geometry with a pump-light-transparent heat sink as shown in FIG. 1 and FIG. 2, or may be configured in reflective geometry with a non-transparent heat sink, as shown in FIG. 3. In FIG. 3, a mirror layer 20 is provided over a semiconductor substrate 40. A quantum-well region 22 is formed over the mirror layer 20 and a cladding layer 42 is formed over the quantum-well region 22. A transparent material such as sapphire 44 is bonded to the cladding layer 42 to provide for the main body of the cavity. An exit mirror 18 is disposed on an opposite end of the body 44 forming a resonant cavity between mirror 18 and mirror 20. The quantum-well region 22 of the laser is pumped optically at the exit mirror 18 of the device. Pump source 10 provides light 32 which is focused by focusing optics 12 onto the quantum-well region 22. A resonant beam oscillates between mirror 18 and mirror 20 with optical lens 34 stabilizing the mode. The exit mirror 18 is partially transmissive of light at the mode wavelength, and thus a beam 30 is emitted. Note that in this particular embodiment of FIG. 3, the semiconductor substrate 40 is not part of the resonant cavity, unlike the embodiments of FIG. 1 and FIG. 2 wherein the semiconductor substrate 16 forms the main body of the resonant cavity.

In another embodiment of FIG. 3, the semiconductor substrate 40 can be used as the main body 44 of the cavity if it is transparent at the pump and important laser mode wavelengths. In this case, the semiconductor layers 42 and 22, as well as mirror layer 20 are formed on the semiconductor substrate 44. The body 40 of FIG. 3 is then a heatsink bonded to the laser structure. In this case, the heat sink 40 need not be transparent as pump light does not pass therethrough as in FIG. 1.

An electric field may be provided at terminals 46 and 48 in a direction transverse to the direction of the oscillating laser beam. This sweeps the optically excited carriers out of the gain region, providing a means for amplitude modulating the laser output. Applying voltages approaching 10 to 30 volts across a 100 micrometer mode diameter provides a means for modulating the amplitude of the beam 30 at rates greater than 1 GHz.

Figure 4A:
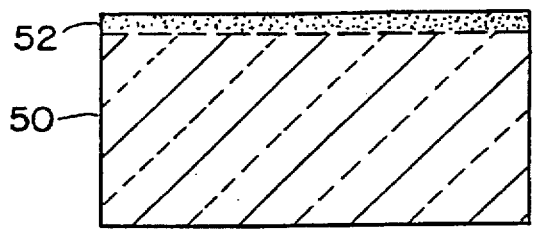
FIGS. 4A through 4E are cross-sectional views of a process for forming a semiconductor laser in accordance with the present invention.

FIG. 4A through FIG. 4E are cross-sectional views of a process for forming a semiconductor laser in accordance with the present invention. In FIG. 4A, a semiconductor wafer substrate 50 is provided having a thickness of approximately a few hundred micrometers to a few millimeters, or longer. Preferred substrate materials and quantum-well materials are, but not restricted to binary, ternary, or quaternary compounds taken from the group III–V table of elements and include GaAs or InP. For laser geometries, such as in FIGS. 1 and 2, the substrate material must be transparent for intended lasing wavelengths.

Figure 4B:
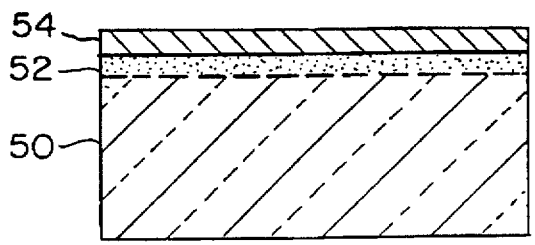
Figure 4C:
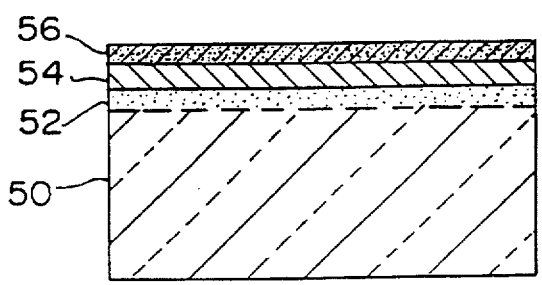
Figure 4D:
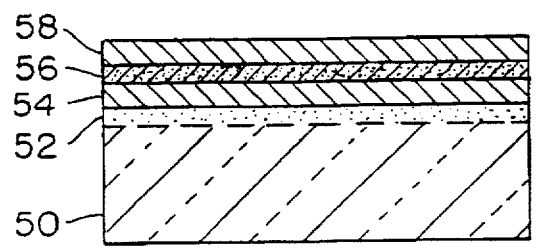
Figure 4E:
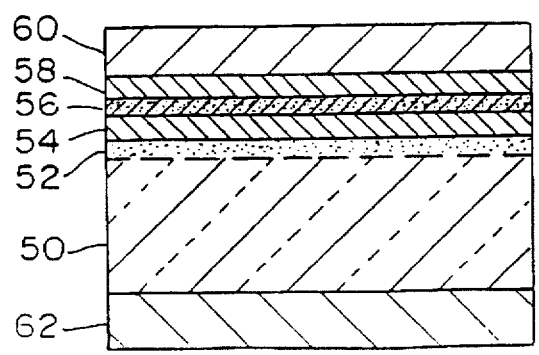

An optional buffer layer 52 may be formed over the substrate 50 to help lattice-match the substrate material to the quantum-well material. In FIG. 4B, a barrier layer 54 comprising, for example AlGaAs, is provided over the optional buffer layer 52. In FIG. 4C, a quantum-well layer 56 comprising, for example, GaAs or InGaAs is provided over the barrier layer 54. In FIG. 4D, a second barrier layer 58 is provided over the quantum-well layer 56. Several quantum-well layers spaced by the barrier layers may be formed over the first quantum-well. In FIG. 4E, a reflective mirror 60 is formed above the second barrier layer 58, and a second reflective mirror 62 is formed on the opposite face of the semiconductor wafer 50.

Figure 5:
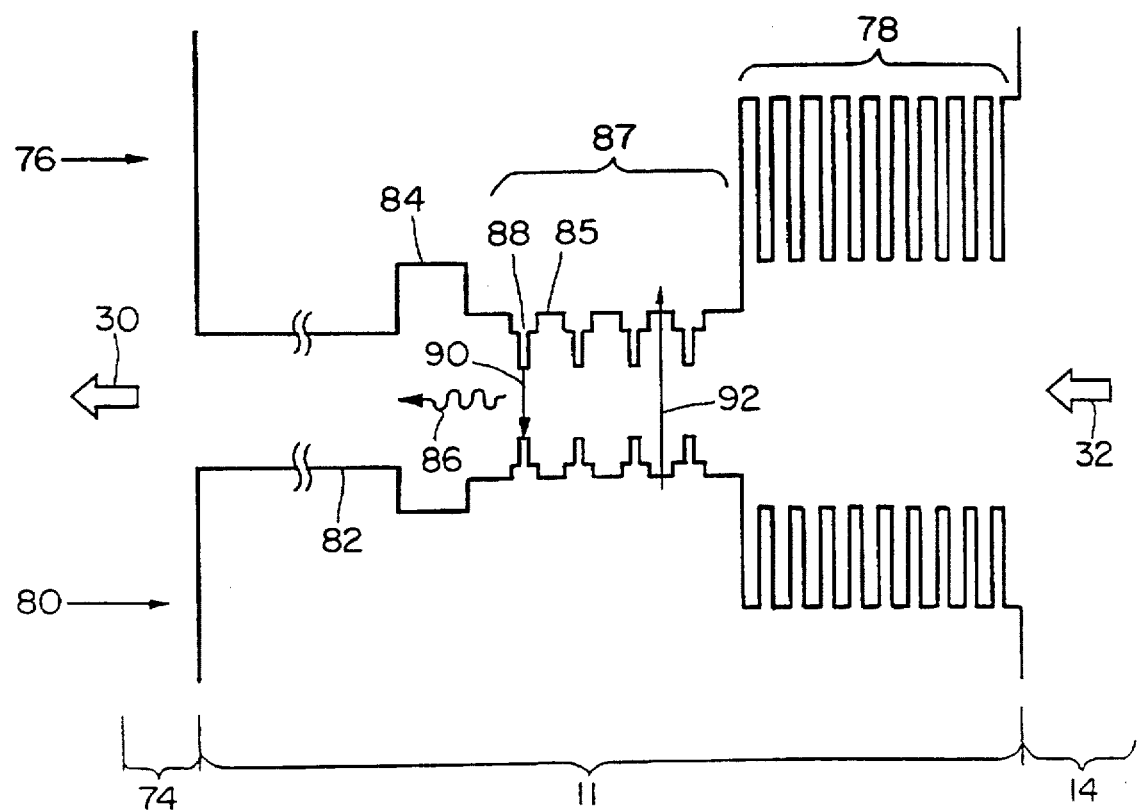
FIG. 5 is a bandgap diagram of a semiconductor laser in accordance with the present invention.

FIG. 5 is a bandgap diagram of a semiconductor laser configured in transmitting geometry such as those lasers shown in FIG. 1 and FIG. 2. The bandgap diagram shows both the conduction band 76 and the valence band 80 of the semiconductor laser. Pump light 32 is transferred through the transparent heat sink 14 into the semiconductor laser region 11. The pump light 32 passes through a high reflectivity dichroic mirror 78 to the active region 87. The active region 87 includes a plurality of quantum-well regions 88. The number of quantum-wells may vary, depending on the application. Pump absorption occurs in pump-absorbing regions 85 as indicated by arrow 92, creating excited carriers, electrons and holes, which diffuse into the quantum-well regions 88. Carriers recombine in the quantum-well regions 88, as indicated by arrow 90, to emit light 86 at the lasing wavelength. A carrier diffusion barrier 84 prevents excited carriers from spreading into the substrate 82 and thus being lost to the laser gain process. Laser output 30 is emitted at the output mirror 74.

Figure 6:
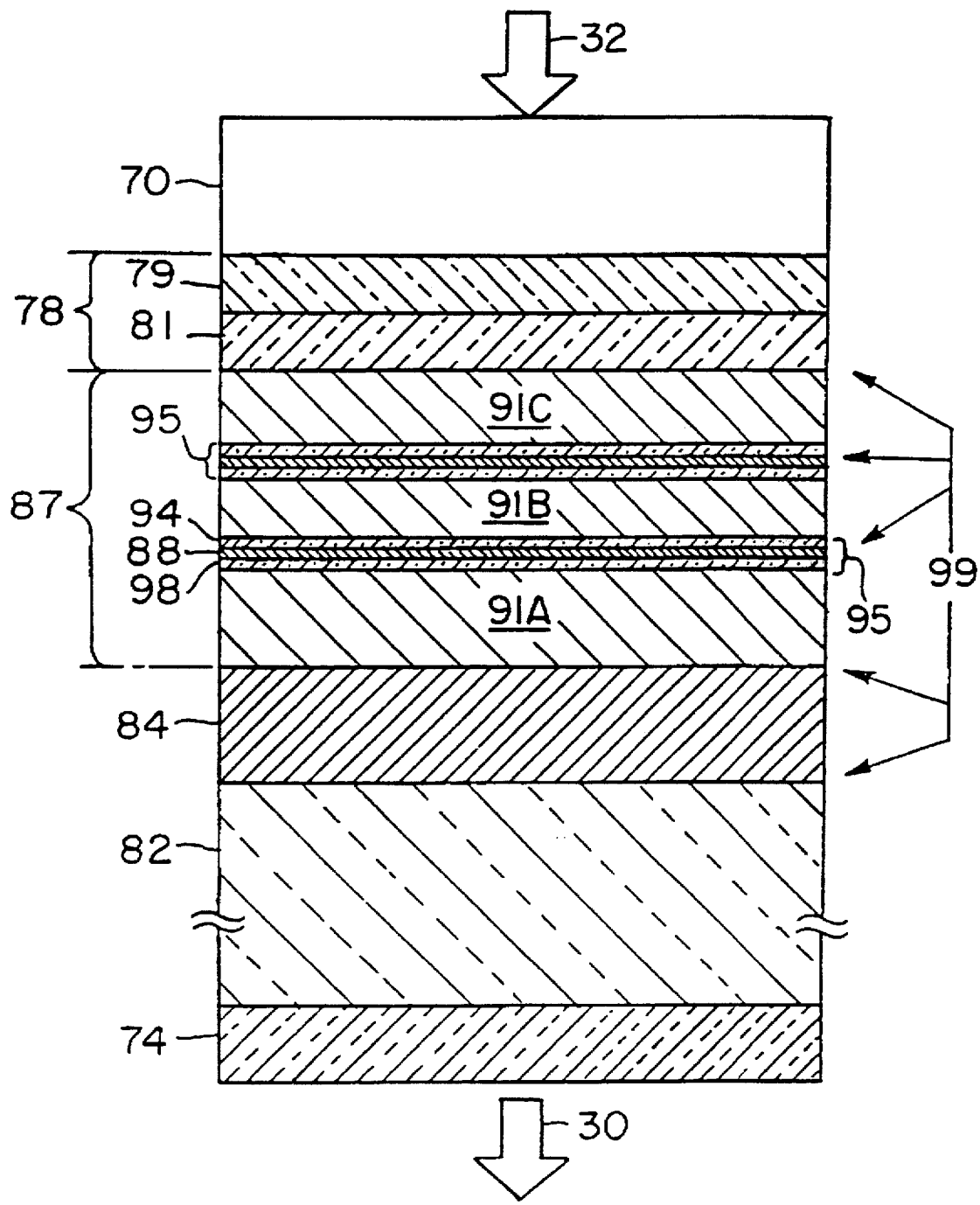
FIG. 6 is an illustration of a quantum-well wafer structure for a semiconductor laser in accordance with the present invention.

FIG. 6 is an illustration of a quantum-well wafer structure for the semiconductor laser of FIG. 1 and FIG. 2, corresponding to the bandgap diagram of FIG. 5 and formed, for example, by the process of FIG. 4. The quantum-well wafer structure is comprised of an undoped GaAs substrate 82 having a high reflectivity mirror 74 formed on one of the faces of the substrate 82. A carrier diffusion barrier 84 is formed on the face of the substrate which is opposite the high reflectivity mirror 74. The carrier diffusion barrier 84 is comprised, for example, of $Al_{0.2}Ga_{0.8}As$ of 288.8 nm thickness. The active region 87 is formed over the carrier diffusion barrier 84. The active region 87 is comprised of a plurality of quantum-wells 88 surrounded by barrier layers 94 and 98. The quantum-well/barrier regions 95 are separated by pump absorbing regions 91A, 91B and 91C. The quantum-well/barrier regions 95 and pump absorbing region 91B are repeated a plurality of times, for example periodically.

The first pump-absorbing layer 91A comprises, for example, $Al_{0.04}Ga_{0.96}As$ of 406.4 nm thickness. The barrier layers 94 and 98 are comprised of, for example, GaAs of 10.0 nm thickness. The quantum-well layers 88 are comprised of, for example, strained $In_{0.2}Ga_{0.8}As$ of 7.7 nm thickness. The second pump-absorbing layer 91B is comprised of, for example, $Al_{0.04}Ga_{0.96}As$ of 112.0 nm thickness. The top of the active region 87 is a pump absorbing layer 91C comprised of, for example, $Al_{0.04}Ga_{0.96}As$ of 126.1 nm thickness. Above the active region 87 is formed a high reflectivity multi-layer mirror 78 comprised of a plurality of layer pairs 81 and 79, for example 30 pairs. The pair comprises, for example, a layer 81 of $Al_{0.16}Ga_{0.84}As$ of 71.7 nm thickness, followed by a layer 79 of AlAs of thickness 82.9 nm.

The multilayer mirror 78 is bonded to a transparent heat sink 70. The laser is pumped 32 through the heat sink 70 and laser output 30 is emitted at mirror 74. The wavelength of the laser output for the above-described example is equal to 980 nm. The GaAs substrate is transparent at this laser wavelength. Note that the quantum-well gain regions 88 are positioned at the antinodes 99 of the laser optical standing wave.

For the optically-pumped laser configurations, no p-n junctions are required, and thus, the quantum-well materials used in the laser need not be doped. The present invention applies equally well to optical pumping as it does to diode current-injection pumping and electron-beam pumping of the semiconductor laser. Radial refractive index changes for transverse spatial mode confinement may also be produced by other techniques such as proton bombardment or ion implantation outside the gain region.

It should be noted that the substrate has been used to form a part of the cavity in the above description and also as the material upon which the multiple quantum-well layers are grown. Alternatively, the multiple quantum-wells can be grown separately and bonded to a light transparent material, such as quartz and sapphire, to form the extended longitudinal portion of the cavity.

In a conventional vertical cavity diode laser having a very short cavity, the absolute position of the cavity mode frequency must lie under the gain bandwidth for laser action to occur. The present invention permits several longitudinal cavity modes under the gain curve. This allows for lasing to occur under various conditions including a change of temperature as described in "Enhanced Performance of Offset-Gain High-Barrier Vertical-Cavity Surface-Emitting Lasers" by D. B. Young, et al., IEEE Journal of Quantum Electronics Vol. 29, 2013–2021, 1993.

The laser output of the present invention may be converted to other frequencies by second harmonic, sum, and difference frequency generation, or optical parametric conversion. This can be accomplished using well known non-linear optical materials, such as KTP or $KNbO_3$. In contrast to most semiconductor lasers wherein the circulating intracavity power is slightly greater than the output power, the present invention has significantly greater circulating power densities thereby providing efficient intracavity harmonic conversion. The non-linear material may be bonded directly to the semiconductor wafer for mass production and to provide a robust structure. For intracavity frequency conversion, the second harmonic light propagating away from the output coupler will be absorbed in the semiconductor material, thereby optically pumping it. Alternatively, a dichroic mirror transparent at the laser wavelength and highly reflecting at the second harmonic wavelength can be deposited at the interface between the nonlinear optical material and the semiconductor.

A train of short optical pulses may be produced at the output of the laser using gain-switched, Q-switched, or modelocked laser operation. For example, passive Q-switching or modelocking can be accomplished by incorporating unpumped quantum-well regions inside the laser cavity.

The laser can be operated in an external cavity to extend functionality of the device. For example, a laser in accordance with the present invention having an external cavity may be tuned by a grating reflector, may be modelocked or may have narrow linewidth operation. A laser in accordance with the present invention may use an external cavity for transverse spatial mode control.

In fiber optical communication applications which require a suppression of the Stimulated Brillouin Scattering (SBS), it is important to reduce the power in each axial mode of the laser and have more such modes oscillating. This can be done by placing the quantum-well regions near the center of the cavity in the anti-node positions corresponding to the different axial mode numbers. This is the equivalent of induced spatial hole burning. By keeping the excited carriers confined within the quantum-well regions and separating these regions by diffusion barriers, the carriers will be unable to interact with each other by thermal diffusion, ensuring multimode operation through the equivalent of longitudinal spatial hole burning. Such devices could be used to transmit high power levels over long distances, for example remotely pumping optical fiber amplifiers for submarine communications. SBS can also be suppressed by frequency chirping or shifting the mode frequencies in a time which is short compared to the SBS build-up times. Frequency shifting could be accomplished by applying a longitudinal electric field to the quantum-well structure to provide a Stark shift to the gain peak. More conventional intracavity tuning techniques could also be used to shift the frequencies.

Note that the term "forming" as used herein is intended to broadly encompass methods such as depositing, sputtering, bonding, or other techniques for combining one or more materials.

Figure 7:
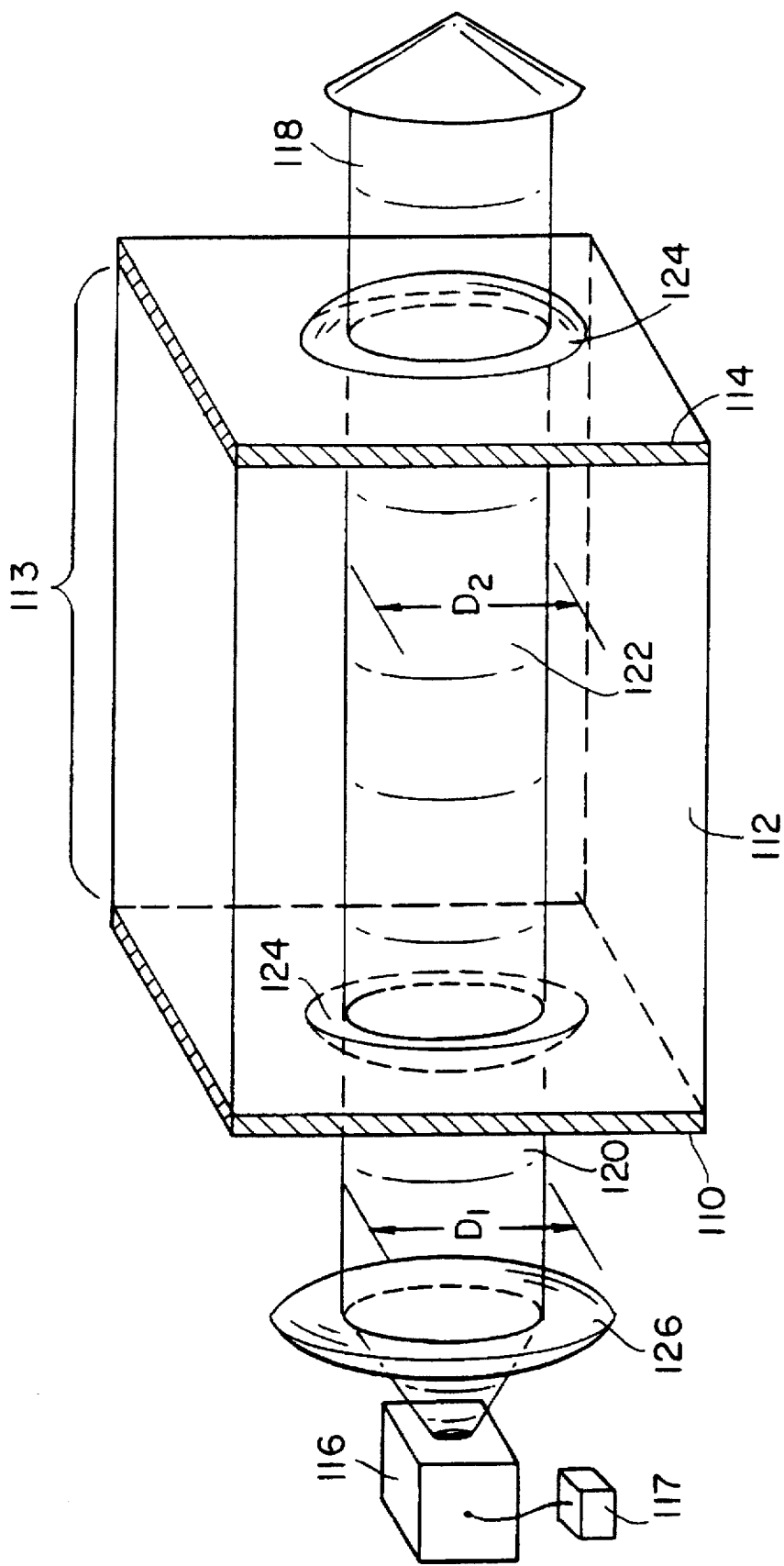
FIG. 7 is a perspective view of a microchip laser embodying the present invention.

FIG. 7 is a perspective view of a preferred embodiment of a microchip laser in accordance with the present invention. A gain medium 112, formed of a material having a temperature variant index of refraction dn/dT, for example Nd:YAG, is disposed between a pair of substantially flat and parallel reflective surfaces 110, 114. The reflective surfaces may be formed according to the methods described above. They operate as entrance 110 and exit 114 mirrors of a resonant laser cavity 113. An optical pump source 116 and optional focusing optics 126 provide a pump beam 120 for longitudinally pumping the cavity 113.

The pump energy 120 initiates laser gain within the cavity 113, causing a laser mode 122 to propagate therein. The pump energy beam 120 heats up a central longitudinal portion of the gain medium 112. The heating is most intense in the center portion of the gain medium 112, where the laser mode 122 propagates, and is incrementally cooler radially outward from the center, forming a cross-sectional temperature gradient. The combination of a transverse temperature gradient in a material having a temperature variant index of refraction dn/dT causes a thermal lens 124 to form in the cavity 113. The thermal lens has the effect of producing a cavity with slightly curved mirrors 124, which stabilizes the diameter $D_2$ of the resonant laser mode 122. As pump power is increased, the gain medium 112 absorbs more energy and becomes hotter, decreasing the radius of curvature of the thermal lens 124, and thus, reducing the diameter $D_2$ of the laser mode 122.

It is well known that the geometry of a laser cavity, including cavity length, mirror radii of curvature, and mirror reflectivities, determines the characteristics of the mode resonating therein. The resonant mode characteristics include mode diameter, mode volume, and mode density. In the present invention, the pump power level is controlled by a controller 117 to form a thermal lens 124 of sufficient radius of curvature so as to match the diameter $D_2$ of the laser mode 122 to the diameter $D_1$ of the pump beam 120. This maximizes the pump energy 120 to output energy 118 and power conversion efficiency as well as ensuring operation in a single spatial mode ($TEM_{00}$). In prior art devices such as those described in U.S. Pat. No. 4,710,940, the pump characteristics had to be matched to a predetermined laser cavity geometry. The present invention overcomes this limitation by providing a cavity which automatically adapts its geometry to the pump characteristics.

For a laser having two slightly curved mirrors due to thermal lensing, the cavity mirror radius of curvature R is related to the optical length of the cavity L, the wavelength of the resonating laser mode $\lambda$ and the mode diameter D, according to the formula of Equation 1 above. Rearranging the terms of Equation 1, the diameter D of the laser mode is expressed as function of the radius of curvature R of the cavity mirrors:

$$D = \left( \lambda L \left( \frac{8R}{\pi^2 L} \right)^{1/2} \right)^{1/2} \quad (4)$$

A laser cavity having two curved mirrors of radius R is the physical approximation of a flat-flat cavity having an induced thermal lens of radius of curvature R. The radius of curvature R of the thermal lens is a function of the index of refraction $n_0$ of the gain medium material, the diameter $D_{th}$ and thickness $h_{th}$ of the heated region of the cavity, the temperature rise at the center of the heated region $\Delta T$ and the differential change in index of refraction per unit of temperature dn/dT for the gain medium material. These parameters are related according to the formula of Equation (2) above for a cavity with two curved mirrors. Note that the curvature shown in the mirrors of FIG. 7 induced by the thermal lens 124 is exaggerated for the purpose of illustration. The thermal lens or mirrors actually exhibit radii of curvature R which are approximately 50 to 1,000 times the optical length of the cavity L.

A flat-flat mirror configuration is inherently an unstable laser cavity structure. The present invention is well suited for operation in microchip lasers having relatively short cavity lengths of about 1 mm with thermally-induced mirror radii which are much greater than the cavity length (about 10 cm to 100 cm).

Figure 8A:
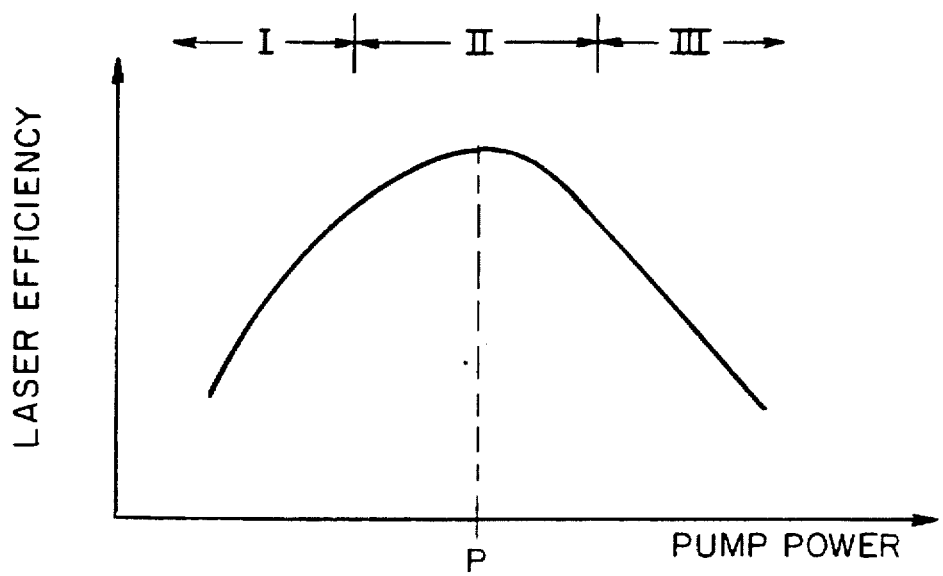
FIG. 8A is a graph of laser efficiency as a function of pump power.
Figure 8B:
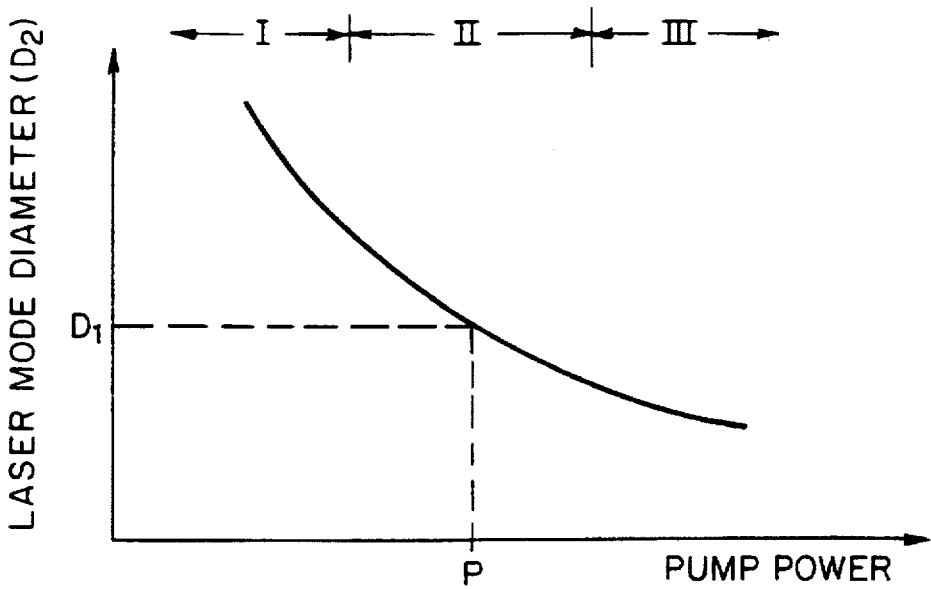
FIG. 8B is a graph of laser mode diameter as a function of pump power.
Figure 9A:
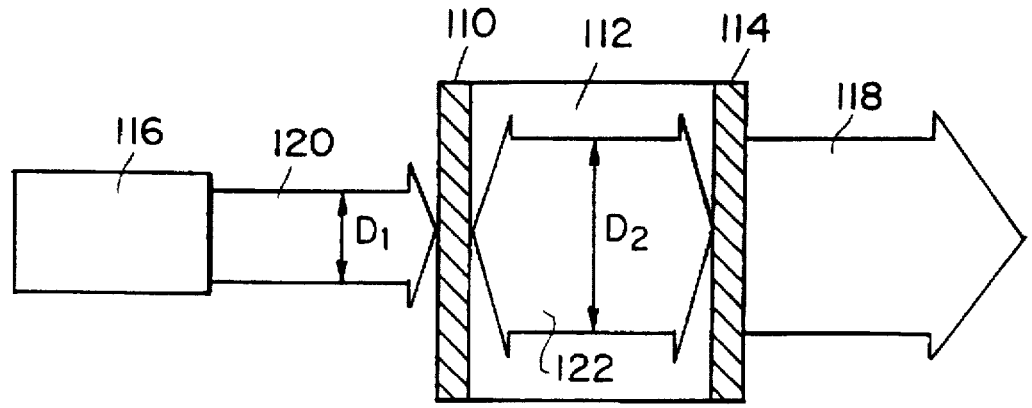
FIGS. 9A, 9B, and 9C are side views of the laser of FIG. 7, demonstrating the relationship between the pump diameter and mode diameter for various pump powers.
Figure 9B:
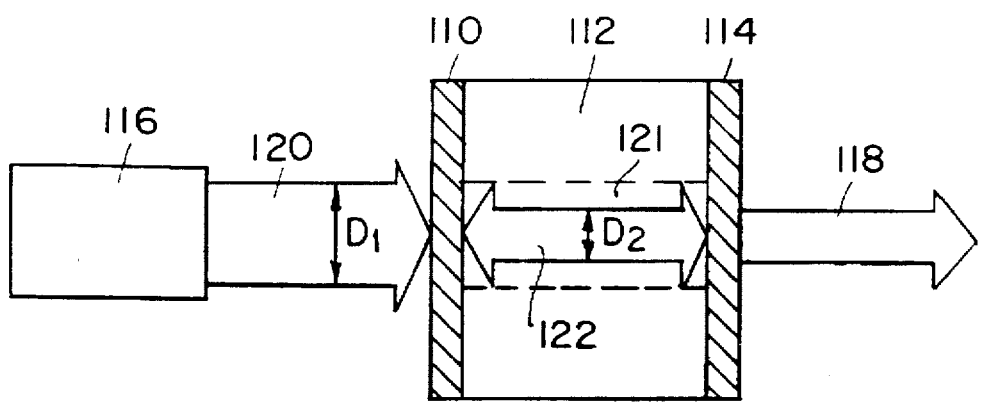
Figure 9C:
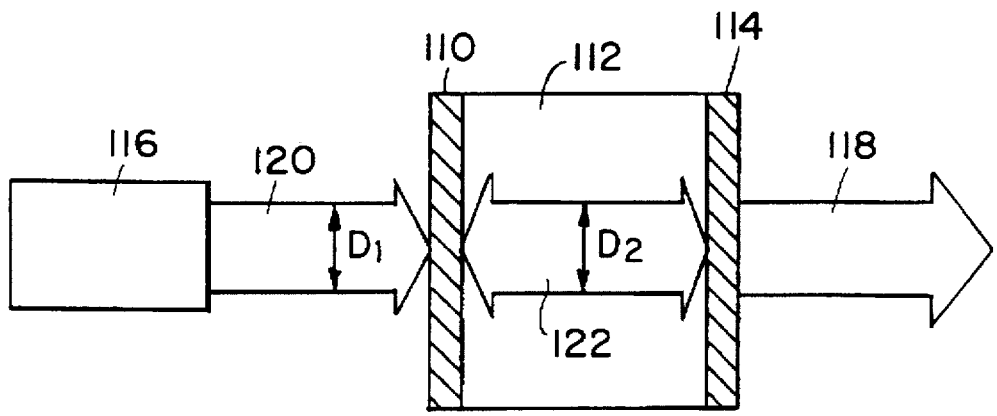

The present invention controls the pump power such that maximum laser efficiency is achieved. FIG. 8A is a graph of laser efficiency as a function of pump power. For pump powers corresponding to Region I, laser efficiency increases as pump power increases. In Region II, the conversion efficiency is at a maximum for pump powers near P. For pump powers in Region III, the efficiency tapers off as the gain medium becomes saturated. In FIG. 8B, laser mode waist diameter $D_2$ is charted as a function of pump power. At low levels of pump power corresponding to Region I, the mode diameter $D_2$ is large relative to the pump diameter $D_1$, because at low pump power levels, the effect of the thermal lens in concentrating the laser beam is limited. As pump power increases, the mode diameter decreases. At high pump power levels corresponding to Region III, the mode diameter $D_2$ converges on a minimum value as the gain medium becomes saturated. The pump power level P of Region II which causes the laser mode waist diameter $D_2$ to be nearly equivalent to the pump diameter $D_1$ is of particular significance. At this level, input to output conversion efficiency is at a maximum as shown by the dotted line connecting the graph of FIG. 8B to FIG. 8A. FIGS. 9A–9C are side views of a microchip laser embodying the present invention being pumped by pump beams 120 of constant diameter $D_1$ and various pump powers. In FIG. 9A the pump source 116 directs a beam of pump light 120, of diameter $D_1$ longitudinally into the cavity defined by the mirrors 110 and 114. The pump power for the pump in FIG. 9A is relatively low (corresponding to Region I of FIGS. 8A and 8B) and thus the radius of curvature of the induced thermal lens is relatively large or infinite. This causes the cavity to be nearly instable, and thus, the diameter $D_2$ of the resonating mode 122 is relatively large and unfocused. Thus, the output beam 118 is of large diameter and of low power density.

In FIG. 9B, the pump power is relatively high (corresponding to Region II of FIGS. 8A and 8B) which overheats the saturated center portion of the gain medium 112. This induces a thermal lens having a relatively small radius of curvature which concentrates the resonating mode 122 within a diameter $D_2$ which is less than that of the pump diameter $D_1$. Thus, a cylindrical region 121 of the gain medium defined by the region of inner diameter $D_2$ and of outer diameter $D_1$ is pumped by the pump 116 and is not converted into laser light by the resonating laser mode $D_2$. This results in a focused output beam 118 of high power density and of relatively small diameter $D_2$ but of relatively low power conversion efficiency because of the wasted pump energy.

In FIG. 9C, the cavity is pumped at an appropriate power level for maximizing power conversion efficiency (corresponding to Region II of FIGS. 8A and 8B) such that the thermal lens concentrates the resonating laser beam 122 within a diameter $D_2$ which is nearly equivalent to the pump diameter $D_1$. In this way, optimal laser efficiency is achieved as shown in Region II of the charts of FIGS. 8A and 8B. Laser output 118 is emitted having a diameter $D_2$ which is nearly equivalent to that of the pump beam diameter $D_1$.

The above conditions apply to a range of operating parameters. If commercial pump diode lasers with emitting widths of 100 micrometers are used, the microchip laser mode volume will adjust to the diode pump volume at pump power levels of over one watt continuous wave. Alternatively, the output from the pump diode laser can be optically shaped to a predetermined dimension through which the mode diameter of the microchip laser will become matched at the appropriate pump power level. Typical pump power levels can range from several tens of milliwatts to several watts. If the active medium is formed of a material having a negative dn/dT, under certain circumstances, the material will produce curved mirrors that will stabilize the cavity and maximize the output power in the same way as described above. In such a case, the thermal bulging of the ends of the material to form a cavity mirror is greater than the effect of the negative lensing from the thermally-induced index profile.

The automatic mode-matching effects of FIGS. 7, 8, and 9 are applicable to the vertical cavity semiconductor lasers described above. Such semiconductor lasers may include either quantum-well or bulk gain media. In the case of semiconductor gain media, the pump light is usually absorbed in a region that is much shorter than the optical cavity length.

Figure 10A:
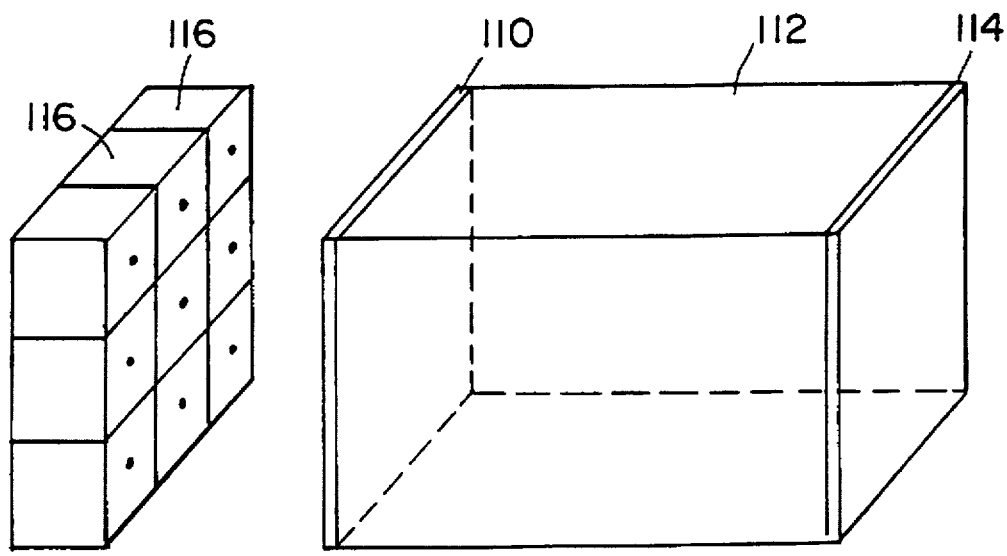
FIGS. 10A and 10B are perspective views of the laser of FIG. 7 being pumped by an array of diode pumps.
Figure 10B:
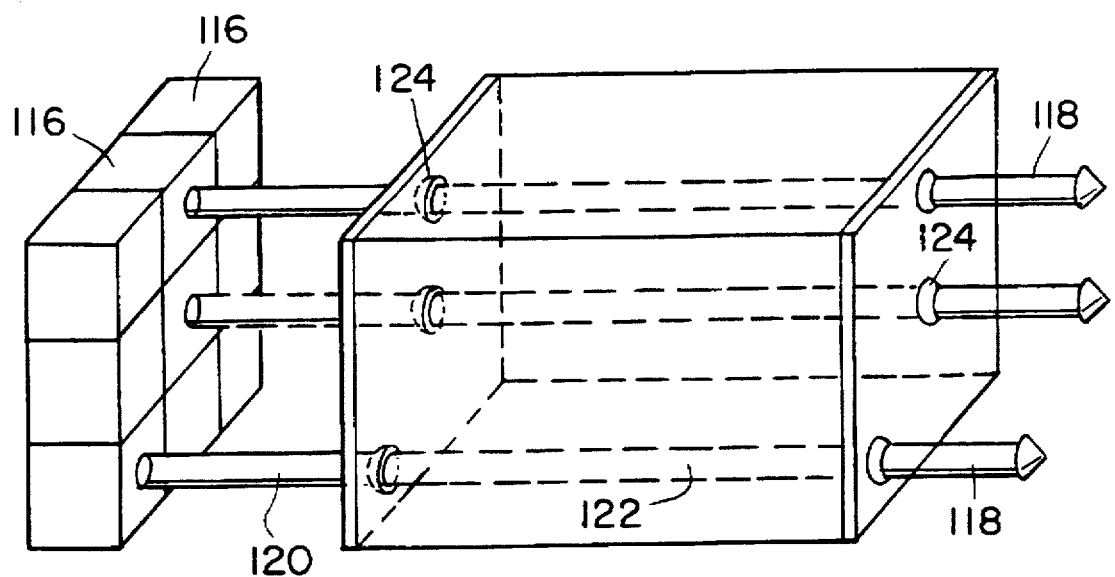

The invention is further applicable to one and two dimensional arrays of lasers as shown in FIGS. 10A and 10B. In FIG. 10A, a continuous plane of active medium 112 is pumped by an array of individual diode pumps 116. Before pumping, the cavity mirrors 110, 114 are flat and parallel. As various pumps 116 are activated as shown in FIG. 10B, laser beams 122 resonate and portions of the cavity become heated, forming thermal lenses 124 for stabilizing the beams 122. The diameter and power of the pump beams 120 control the diameter of the laser beams 122. The lateral spacing between pump beams 120 defines the spacing between output beams 118. The laser of FIGS. 10A and 10B is adaptable to various pump beam array configurations.

While this invention has been particularly shown and described with references to preferred embodiments thereof, it will be understood by those skilled in the art that various changes in form and details may be made therein without departing from the spirit and scope of the invention as defined by the appended claims.

We claim:

1. A semiconductor laser system comprising:

a) a body of material having first and second opposed faces, said body having a temperature variant index of refraction;

b) a semiconductor quantum-well structure on said first face of said body, said quantum-well structure having a temperature variant index of refraction;

c) a first mirror on said quantum-well structure;

d) a second mirror on said second face of said body, said first and second mirrors defining a resonant cavity therebetween of length L; and e) an energy source for pumping said quantum-well structure with energy for producing laser gain in said quantum-well structure, said laser gain causing a laser beam of wavelength $\lambda$ to propagate within said cavity, said energy being absorbed by said quantum-well structure thereby raising the temperature of a region proximal to said quantum-well structure by an amount $\Delta T$, said region being of diameter $D_{th}$ and thickness $h_{th}$, forming a thermal lens within said resonant cavity having an effective radius of curvature R which is a function of said diameter $D_{th}$, said thickness $h_{th}$, and said rise in temperature $\Delta T$ of said region, said thermal lens concentrating said laser beam substantially within a diameter D, said diameter of laser beam concentration D being substantially equivalent to said diameter of said heated region $D_{th}$, said diameter D being a function of said thermal lens radius of curvature R, said length of said cavity L, and said wavelength $\lambda$ of said laser beam, said cavity being of sufficient length L such that a stable transverse mode of said laser beam is produced.

2. The system of claim 1, wherein said diameter of said heated region $D_{th}$ is controlled by said energy source.

3. The system of claim 1, wherein said pump energy is directed into said cavity through said second mirror.

4. The system of claim 3 further comprising a heat sink on said first mirror which is non-transparent to energy at said energy source wavelength.

5. The system of claim 1 further comprising a heat sink on said first mirror which is transparent to energy at said energy source wavelength, and wherein said pump energy is directed into said cavity through said heat sink and said first mirror.

6. A method of producing a laser beam from a semiconductor laser comprising the steps of:

a) forming a semiconductor quantum-well structure over a first face of a body of material having opposing first and second faces said body being relatively thick as compared to said quantum-well structure;

b) forming a first mirror on said quantum-well structure; and c) forming a second mirror on said second face of said body, said first and second mirrors defining a resonant cavity therebetween;

d) optically pumping said cavity in a longitudinal direction with pump energy of a power, said pump energy heating a region within a first diameter proximal to said quantum-well structure, forming a thermal lens which produces a stable transverse mode resonator for concentrating a laser beam produced by said pumping within a second diameter; and e) setting the power of said pump energy such that said second diameter is substantially equivalent to said first diameter.

7. A method of producing laser light from a semiconductor laser system comprising the steps of:

a) providing a semiconductor quantum-well structure on a first face of a body of material having opposed first and second faces, said body and said quantum-well structure each having a temperature variant index of refraction;

b) providing a first mirror on said quantum-well structure;

c) providing a second mirror on said second face of said body, said first and second mirrors defining a resonant cavity therebetween of length L; and d) pumping said quantum-well structure with pump energy for producing laser gain in said quantum-well structure, said laser gain causing a laser beam of wavelength $\lambda$ to propagate within said cavity, said energy being absorbed by said quantum-well structure thereby raising the temperature of a region proximal to said quantum-well structure by an amount $\Delta T$, said region being of diameter $D_{th}$ and thickness $h_{th}$, forming a thermal lens within said resonant cavity having an effective radius of curvature R which is a function of said diameter $D_{th}$, said thickness $h_{th}$, and said rise in temperature $\Delta T$ of said region, said thermal lens concentrating said laser beam substantially within a diameter D, said diameter of laser beam concentration D being substantially equivalent to said diameter of said heated region $D_{th}$, said diameter D being a function of said thermal lens radius of curvature R, said length of said cavity L, and said wavelength $\lambda$ of said laser beam, said cavity being of sufficient length L such that a stable transverse mode of said laser beam is produced.

8. The method of claim 7, further comprising the step of controlling the diameter $D_{th}$ or thickness $h_{th}$ of said heated region by adjusting said pump energy.

9. The method of claim 1, further comprising the step of directing said pump energy into said cavity through said second mirror.

10. A method for generating a laser beam comprising the steps of:

a) disposing an active medium between two opposed substantially parallel reflective surfaces;

b) pumping the active medium through one of said surfaces with a pump beam of a first diameter and of a power, said pump beam heating a region of said active medium, forming a positive thermal lens; said lens forming a stable transverse mode resonator between the two reflective surfaces for transverse confinement of a laser beam produced by said pumping within a second diameter, said second diameter being a function of said pump beam; and c) setting said pump beam such that said second diameter is substantially equivalent to said first diameter.

11. The method of claim 10, wherein the step of disposing an active medium includes disposing a solid-state gain medium.

12. The method of claim 10, wherein the step of disposing an active medium includes disposing a semiconductor gain medium.

13. The method of claim 10, wherein the step of pumping comprises pumping with an array of optical pumps, for energizing a plurality of laterally spaced segments of said active medium.

14. A laser system comprising:
a) an active medium disposed between two opposed substantially parallel reflective surfaces; and
b) a pump source for pumping said active medium through one of said reflective surfaces with a pump beam; said pump beam having a power and being concentrated within a first diameter; said pump beam heating a region of said active medium, forming a positive thermal lens; said lens forming a stable transverse mode resonator between the two reflective surfaces for transverse confinement of a laser beam produced by said pumping within a second diameter, said second diameter being a function of said pump beam; said pump beam being set such that said second diameter is substantially equivalent to said first diameter.

15. The laser system of claim 14 wherein said active medium comprises a quantum-well semiconductor gain medium.

16. The laser system of claim 14 wherein said active medium comprises solid-state gain medium.

17. The system of claim 14, wherein said pump source comprises an array of optical pumps for producing laser gain in a plurality of laterally-spaced segments of said active medium.

18. The method of claim 10, further comprising the step of forming one of the reflective surfaces to be an input surface substantially transmissive of the pump beam and substantially reflective of the laser beam and forming the other reflective surface to be an output surface substantially reflective of the pump beam and partially transmissive of the laser beam.

19. The method of claim 10, further comprising the step of forming the active medium of a material having a positive dn/dT.

20. The method of claim 10, wherein said active medium comprises a gain medium selected from the group consisting of solid-state and semiconductor materials in combination with a material selected from the group consisting of non-linear and electro-optic materials.

21. The method of claim 10 wherein the step of setting said pump beam comprises setting the power of said pump beam such that the second diameter is substantially equivalent to the first diameter.

22. The method of claim 10 wherein the step of setting said pump beam comprises setting the first diameter of said pump beam such that the second diameter is substantially equivalent to the first diameter.

23. The method of claim 10 further comprising the step of forming the active medium with a material selected from the group consisting of Nd:YAG, Nd:YVO$_4$, GSGG, GGG, Nd:Glass, Er:Glass.

24. The laser system of claim 14 wherein the reflective surfaces comprise an input surface substantially transmissive of the pump beam and substantially reflective of the laser beam and an output surface substantially reflective of the pump beam and partially transmissive of the laser beam.

25. The laser system of claim 14 wherein the active medium comprises a material having a positive dn/dT.

26. The laser system of claim 14 wherein said active medium comprises a gain medium selected from the group consisting of solid-state and semiconductor materials in combination with a material selected from the group consisting of non-linear and electro-optic materials.

27. The laser system of claim 14 wherein the power of said pump beam is set such that the second diameter is substantially equivalent to the first diameter.

28. The laser system of claim 14 wherein the first diameter of said pump beam is set such that the second diameter is substantially equivalent to the first diameter.

29. The laser system of claim 14 wherein the active medium comprises a material selected from the group consisting of Nd:YAG, Nd:YVO$_4$, GSGG, GGG, Nd:Glass, Er:Glass.

30. A method for generating a laser beam comprising the steps of:
a) disposing a semiconductor active medium between two opposed substantially parallel reflective surfaces;
b) pumping the active medium through one of said surfaces with a pump beam of a first diameter and of a power, said pump beam heating a region of said active medium, forming a positive thermal lens; said lens forming a stable transverse mode resonator between the two reflective surfaces for transverse confinement of a laser beam produced by said pumping within a second diameter, said second diameter being a function of said pump beam; and
c) setting said pump beam such that said second diameter is substantially equivalent to said first diameter.

31. A method for generating a laser beam comprising the steps of:
a) disposing an active medium between two opposed substantially parallel reflective surfaces;
b) pumping an array of laterally spaced segments of the active medium through one of said surfaces with a corresponding array of pump beams, each pump beam being of a first diameter and of a power, each pump beam heating a region of said segment of said active medium, forming an array of positive thermal lenses; each lens forming a stable transverse mode resonator between the two reflective surfaces for transverse confinement of a laser beam produced by said pumping, each laser beam being confined within a second diameter, said second diameter being a function of said pump beam; and
c) setting each pump beam such that said second diameter is substantially equivalent to said first diameter.

32. The method of claim 31, wherein the step of disposing an active medium comprises disposing a solid-state gain medium.

33. A laser system comprising:
a semiconductor active medium disposed between two opposed reflective surfaces; and
a pump source for pumping said active medium through one of said reflective surfaces with a pump beam; said pump beam having a power and being concentrated within a first diameter; said pump beam heating a region of said active medium, forming a positive thermal lens; said lens forming a stable transverse mode resonator between the two reflective surfaces for transverse confinement of a laser beam produced by said pumping within a second diameter, said second diameter being a function of said pump beam; said pump beam being set such that said second diameter is substantially equivalent to said first diameter.

34. A laser system comprising:

an active medium disposed between two opposed reflective surfaces; and an array of pump sources for pumping a corresponding array of laterally spaced segments of said active medium through one of said reflective surfaces with an array of pump beams; each pump beam having a power and being concentrated within a first diameter; each pump beam heating a region of said segment of said active medium, forming an array of positive thermal lenses; each lens forming a stable transverse mode resonator between the two reflective surfaces for transverse confinement of a laser beam produced by said pumping, each laser beam being confined within a second diameter, said second diameter being a function of said pump beam; each pump beam being set such that said second diameter is substantially equivalent to said first diameter.

35. The laser system of claim 34 wherein the active medium comprises a solid-state gain medium.

* * * * *

UNITED STATES PATENT AND TRADEMARK OFFICE
CERTIFICATE OF CORRECTION

PATENT NO. : 5,627,853
DATED : May 6, 1997
INVENTOR(S) : Aram Mooradian and Mark E. Kuznetsov It is certified that error appears in the above-indentified patent and that said Letters Patent is hereby corrected as shown below:

```
Claim 9, line 1, delete "claim 7" and insert in its
place "claim 1".
```

Signed and Sealed this

Fifth Day of August, 1997

*Attest:*

BRUCE LEHMAN

*Attesting Officer*      *Commissioner of Patents and Trademarks*